(12) United States Patent
Ma

(10) Patent No.: US 9,799,851 B2
(45) Date of Patent: Oct. 24, 2017

(54) ORGANIC LIGHT EMITTING DIODE ARRAY SUBSTRATE HAVING ANGLED MICRO-CAVITY

(71) Applicant: BOE TECHNOLOGY GROUP CO., LTD., Beijing (CN)

(72) Inventor: Wenyu Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/435,960

(22) PCT Filed: Jul. 31, 2014

(86) PCT No.: PCT/CN2014/083373
§ 371 (c)(1),
(2) Date: Apr. 15, 2015

(87) PCT Pub. No.: WO2015/158063
PCT Pub. Date: Oct. 22, 2015

(65) Prior Publication Data
US 2017/0033316 A1    Feb. 2, 2017

(30) Foreign Application Priority Data
Apr. 15, 2014    (CN) .......................... 2014 1 0150514

(51) Int. Cl.
*H01L 29/08*    (2006.01)
*H01L 51/52*    (2006.01)
(Continued)

(52) U.S. Cl.
CPC ...... *H01L 51/5265* (2013.01); *H01L 27/3218* (2013.01); *H01L 51/56* (2013.01)

(58) Field of Classification Search
CPC .. H01L 51/5265; H01L 51/56; H01L 27/3218
See application file for complete search history.

(56) References Cited

U.S. PATENT DOCUMENTS 5,814,416 A * 9/1998 Dodabalapur ...... H01L 51/5265
                                                       313/504
2006/0146297 A1   7/2006 Lee
(Continued)

FOREIGN PATENT DOCUMENTS

CN        102246329 A      11/2011
CN          1800965         5/2012
(Continued)

OTHER PUBLICATIONS

Office Action in Chinese Application No. 201410150514.5 dated Jan. 13, 2015, 7 pages.
(Continued)

*Primary Examiner* — Matthew Gordon
(74) *Attorney, Agent, or Firm* — Blakely Sokoloff Taylor & Zafman LLP

(57) ABSTRACT

The present invention relates to the field of display, and discloses an organic light emitting diode array substrate, a manufacturing method thereof, and a display device, for the purposes of enlarging the color gamut of a display device and improving display quality. The organic light emitting diode array substrate comprises a substrate and multiple micro-cavity organic light emitting diodes which are disposed on the substrate and are arranged in arrays; wherein an angle exists between a light emitting surface of at least one micro-cavity organic light emitting diode and the plane of the substrate. In the embodiments of the invention, an angle exists between a light emitting surface of at least one micro-cavity organic light emitting diode and the plane of the substrate, such that the light with shorter wavelengths in the spectrum of the micro-cavity organic light emitting diode can be emitted in the direction of direct vision. The color coordinate value of a pixel can thus be changed, the pixel color is deepened, the color gamut of the display (Continued)

device is enlarged, the display color is more gorgeous, and the display quality is greatly improved.

11 Claims, 3 Drawing Sheets

(51) Int. Cl.
*H01L 51/56* (2006.01)
*H01L 27/32* (2006.01)

(56) References Cited

U.S. PATENT DOCUMENTS

| | | | |
|---|---|---|---|
| 2009/0206733 A1* | 8/2009 | Hwang | H01L 51/5265 313/504 |
| 2012/0099046 A1 | 4/2012 | Kasai | |
| 2013/0161657 A1 | 6/2013 | Chang et al. | |
| 2014/0159004 A1* | 6/2014 | Xiong | H01L 27/3216 257/40 |

FOREIGN PATENT DOCUMENTS

| | | |
|---|---|---|
| CN | 102472439 | 5/2012 |
| CN | 103187406 | 7/2013 |
| CN | 103268884 A | 8/2013 |
| JP | 2006084876 A | 3/2006 |
| WO | WO-2012/132705 | 10/2012 |

OTHER PUBLICATIONS

Office Action in Chinese Application No. 201410150514.5 dated Jun. 11, 2015, 7 pages.
Office Action in Chinese Application No. 201410150514.5 dated Mar. 13, 2015, 5 pages.
English Translation of Chinese First Office Action, dated Jan. 13, 2015, Chinese Application No. 2014101505145.
English Translation of Chinese Second Office Action, dated Mar. 13, 2015, Chinese Application No. 2014101505145.
English Translation of Chinese Third Office Action, dated Jun. 11, 2015, Chinese Application No. 2014101505145.
International Search Report and Written Opinion with English Language Translation, dated Jan. 16, 2015, Application No. PCT/CN2014/083373.
Chinese Office Action with English Language Translation, dated Sep. 28, 2015, Chinese Application No. 2014101505145.

\* cited by examiner

--Prior Art--

ORGANIC LIGHT EMITTING DIODE ARRAY SUBSTRATE HAVING ANGLED MICRO-CAVITY

FIELD OF THE INVENTION

The present invention relates to the field of display, in particular to an organic light emitting diode array substrate, a manufacturing method thereof, and a display device.

BACKGROUND OF THE INVENTION

OLED (organic light emitting diode) has achieved rapid development since reported in 1987, and has now become a newly developing field of full color panel display; the materials and device structure of OLED have got great development. Since 1990s, people have begun to study Fabry-Perot (F-P) micro-cavity top emitting OLED device, which usually applies a distributed Bragg reflector with a reflectivity up to 99.9% or a metal layer with a reflectivity greater than 95%; two thin metal layers with a reflectivity smaller than the distributed Bragg reflector or the metal layer are used as two electrodes of a light emitting diode; organic functional layers are sandwiched between the two electrodes to form a micro-cavity structure. The micro-cavity structure can improve the ratio of the light emitted from the light emitting layer into the air, i.e., improve the external quantum efficiency of the device; in addition, the full width at half maximum of the emission spectrum of the light emitting material is also reduced, the color of the emitted light is purer.

As shown in FIG. 1, in the section structure of an array substrate for an existing micro-cavity top emitting OLED display device, micro cavity top emitting OLEDs 2 of respective colors are formed on a plane of a substrate 1. At present, the efficiency level of the device made of deep color light emitting material is relatively low; the lifetime is far from the application standard, it is thus limited in the application of display device; it is unable to further increase the color gamut of OLED display device, the display quality is limited.

SUMMARY OF THE INVENTION

The embodiments of the invention provide an organic light emitting diode array substrate, a manufacturing method thereof, and a display device to enlarge the color gamut of a display device and improve the display quality.

An embodiment of the present invention provides an organic light emitting diode array substrate. The organic light emitting diode array substrate comprises a substrate and multiple micro-cavity organic light emitting diodes which are disposed on the substrate and are arranged in arrays; wherein an angle exists between a light emitting surface of at least one micro-cavity organic light emitting diode and the plane of the substrate.

In the embodiments of the present invention, an angle exists between a light emitting surface of at least one micro-cavity organic light emitting diode and the plane of the substrate, such that the light with shorter wavelengths in the spectrum of the micro-cavity organic light emitting diode can be emitted in the direction of direct vision. The color coordinate value of a pixel can thus be changed, the pixel color is deepened, the color gamut of the display device is enlarged, the display color is more gorgeous, and the display quality is greatly improved.

Preferably, a surface of the substrate corresponding to a micro-cavity organic light emitting diode with at least one color comprises slope surfaces. Such a solution can increase the whole color gamut of the display device, and further improve the display quality; moreover, the fabrication process of organic light emitting diode can also be simplified with a good process controllability, so as to improve the product quality and productivity.

Preferably, roots of the slope surfaces are parallel to the column direction; and the tilt directions of slope surfaces corresponding to two adjacent micro-cavity organic light emitting diodes with the same color in the row direction are contrary; or roots of the slope surfaces are parallel to the row direction; and the tilt directions of slope surfaces corresponding to two adjacent micro-cavity organic light emitting diodes with the same color in the column direction are contrary.

Compared with the prior art, such a design can increase the color gamut of the display device; the range of visual angle for the display device will not be reduced in horizontal or vertical direction; however, the range of visual angle for the display device can be further increased in horizontal or vertical direction.

Preferably, the slope angle of the slope surface is less than 40 degrees. When the slope angle of the slope surface is less than 40 degrees (i.e., the angle of inclination for the micro-cavity organic light emitting diode is less than 40 degrees), the color gamut of the display device can be enlarged significantly, and the display quality of the display device can be greatly improved.

Optionally, the slope surface is a slope of a wedge bulge on the substrate, or, the slope surface is a slope of a wedge depression on the substrate.

Preferably, the substrate comprises a substrate board and a graphic layer on the substrate board, the slope surface is formed on the graphic layer; or the substrate comprises a substrate board, the slope surface is formed on the substrate board.

By forming a graphic layer with an etching process, a wedge bulge or a wedge depression can be formed with a simplified process and a low cost. Furthermore, a slope can be formed by modifying the substrate board.

Optionally, the slope angle of the slope surface is greater than 40 degrees; two adjacent slope surfaces form an inverted V shape and correspond to micro-cavity organic light emitting diodes with the same color. Such a solution can not only enlarge the color gamut of the display device, but also apply the array substrate in a display device with double vision function due to the shielding effect between the pixels. The application flexibility of the array substrate can be improved greatly.

Preferably, the slope angle of the slope surface is 60 degrees. In this way, the open ratio and the resolution of a double vision display device can be consistent with the prior art when viewed in any direction.

An embodiment of the present invention also provides a display device comprising an organic light emitting diode array substrate as stated above. The color gamut of the display device is large, the display color is more gorgeous, and the display quality is greatly improved.

An embodiment of the present invention further provides a manufacturing method of an organic light emitting diode array substrate, wherein the method comprises:

forming multiple micro-cavity organic light emitting diodes arranged in arrays on a substrate; wherein an angle exists between a light emitting surface of at least one micro-cavity organic light emitting diode and the plane of the substrate.

The organic light emitting diode array substrate manufactured by the method can be applied in a display device; the color gamut of the display device is enlarged, the display color is more gorgeous, and the display quality is greatly improved.

Preferably, the step of forming multiple micro-cavity organic light emitting diodes arranged in arrays on a substrate comprises:

forming a graphic layer on a substrate board, a slope surface being located on at least one position of the graphic layer corresponding to a micro-cavity organic light emitting diode;

forming a micro-cavity organic light emitting diode on the graphic layer.

In particular, the step of forming a graphic layer on a substrate board comprises:

forming a graphic material layer on the substrate board;

etching the graphic material layer to form a wedge bulge or a wedge depression corresponding to the position of at least one micro-cavity organic light emitting diode.

Optionally, the step of forming multiple micro-cavity organic light emitting diodes arranged in arrays on a substrate comprises:

forming a micro-cavity organic light emitting diode on a substrate board, a slope surface being located on at least one position of the substrate board corresponding to a micro-cavity organic light emitting diode.

REFERENCE SIGNS

1—substrate; 2—micro-cavity OLED; 3—slope surface; 4—wedge bulge; 5—wedge depression; 6—substrate board; 7—graphic layer.

DETAILED DESCRIPTION OF THE INVENTION

To enlarge the color gamut of a display device and improve the display quality, the embodiments of the invention provide an organic light emitting diode array substrate, a manufacturing method thereof, and a display device. In the embodiments of the present invention, an angle exists between a light emitting surface of at least one micro-cavity organic light emitting diode and the plane of the substrate, such that the light with shorter wavelengths in the spectrum of the micro-cavity organic light emitting diode can be emitted in the direction of direct vision. The color coordinate value of a pixel can thus be changed, the pixel color is deepened, the color gamut of the display device is enlarged, the display color is more gorgeous, and the display quality is greatly improved.

The present invention will be described below in more detail in combination with the drawings and the embodiments to make the objects, solutions and advantages of the present invention clearer. The following embodiments are used for explanation of the present invention, not for limitation of the scope of the present invention.

Figure 4:
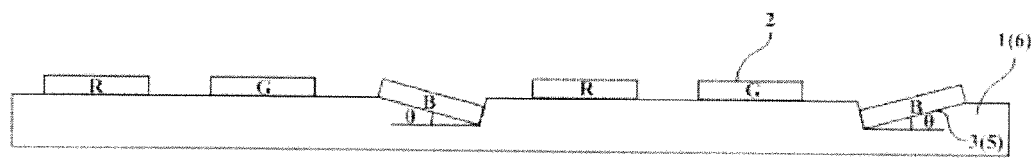
FIG. 4 is a cross section structural schematic diagram of an OLED array substrate according to the first embodiment of the present invention.

As shown in FIG. 4, nn embodiment of the present invention provides an organic light emitting diode array substrate. The organic light emitting diode array substrate comprises a substrate 1 and multiple micro-cavity organic light emitting diodes 2 which are disposed on the substrate 1 and are arranged in arrays; wherein an angle exists between a light emitting surface of at least one micro-cavity organic light emitting diode 2 and the plane of the substrate 1.

The specific type of the micro-cavity OLED 2 is not limited; it can be e.g. a top emitting micro-cavity OLED (emitting light from top electrode of the OLED), or a bottom emitting micro-cavity OLED (emitting light from bottom electrode of the OLED). The multiple micro-cavity OLEDs comprises red light device, green light device and blue device, corresponding to red, green and blue pixels respectively.

In the prior art, the micro-cavity OLEDs are arranged parallel to the substrate plane, the light emitting surfaces of the micro-cavity OLEDs are also parallel to the substrate plane; when the viewing direction has an angle with respect to the direction of direct vision for the display device (i.e., the direction perpendicular to the plane of the substrate), the light with shorter wavelengths in the spectrum of the micro-cavity organic light emitting diode can be emitted in the direction of direct vision, such that the pixel color is deepened, the color of the light is purer. Based on this principle, an angle exists between a light emitting surface of at least one micro-cavity organic light emitting diode and the plane of the substrate, when viewing from the direction of direct vision, the pixel color is deepened, then the color gamut of the display device can be enlarged.

The implementations for the angle between the light emitting surface of the micro-cavity OLED 2 and the plane of the substrate 1 are not limited. A slope surface can be formed on the plane of the substrate; when a micro-cavity OLED is manufactured on the slope surface, an angle exists between the light emitting surface of the micro-cavity OLED and the plane of the substrate. A micro-cavity OLED with an inclined light emitting surface can also be formed on the plane of the substrate.

Preferably, a surface of the substrate 1 corresponding to a micro-cavity OLED 2 with at least one color comprises slope surfaces 3. Such a solution can increase the whole color gamut of the display device, and further improve the display quality; moreover, the fabrication process of organic light emitting diode can also be simplified with a good process controllability, so as to improve the product quality and productivity.

Figure 1:
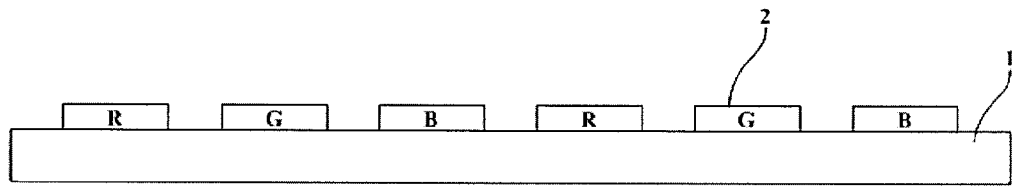
FIG. 1 is a cross section structural schematic diagram of an OLED array substrate in the prior art.
Figure 2:
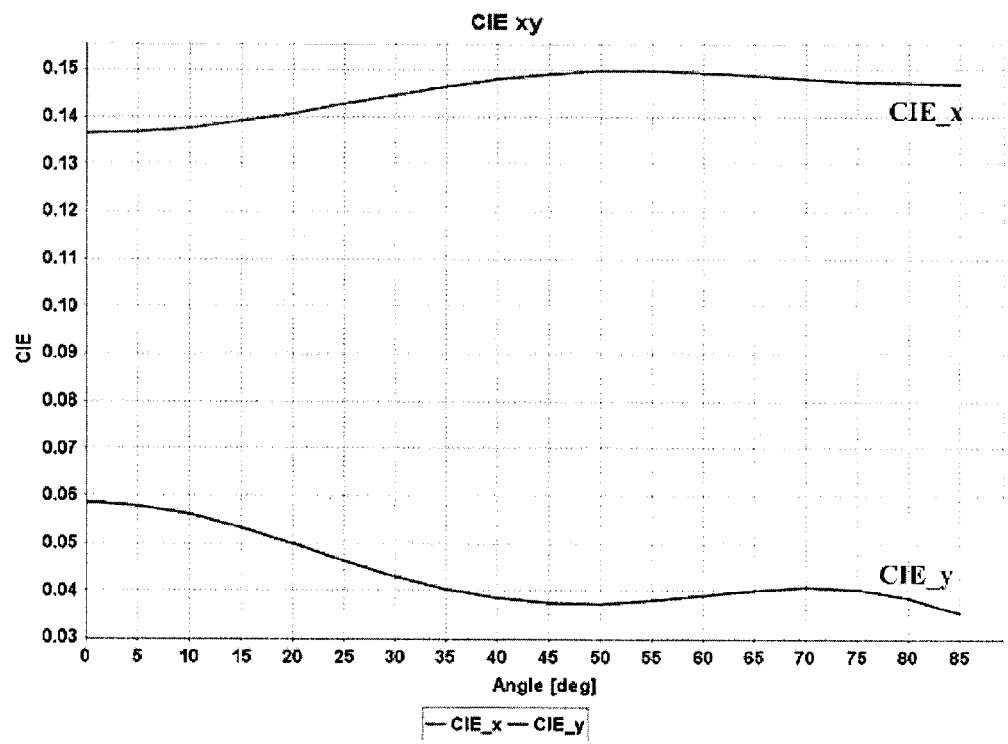
FIG. 2 is an optical characteristic curve of color coordinate of a blue light device in the prior art changing with the horizontal viewing angle.
Figure 3:
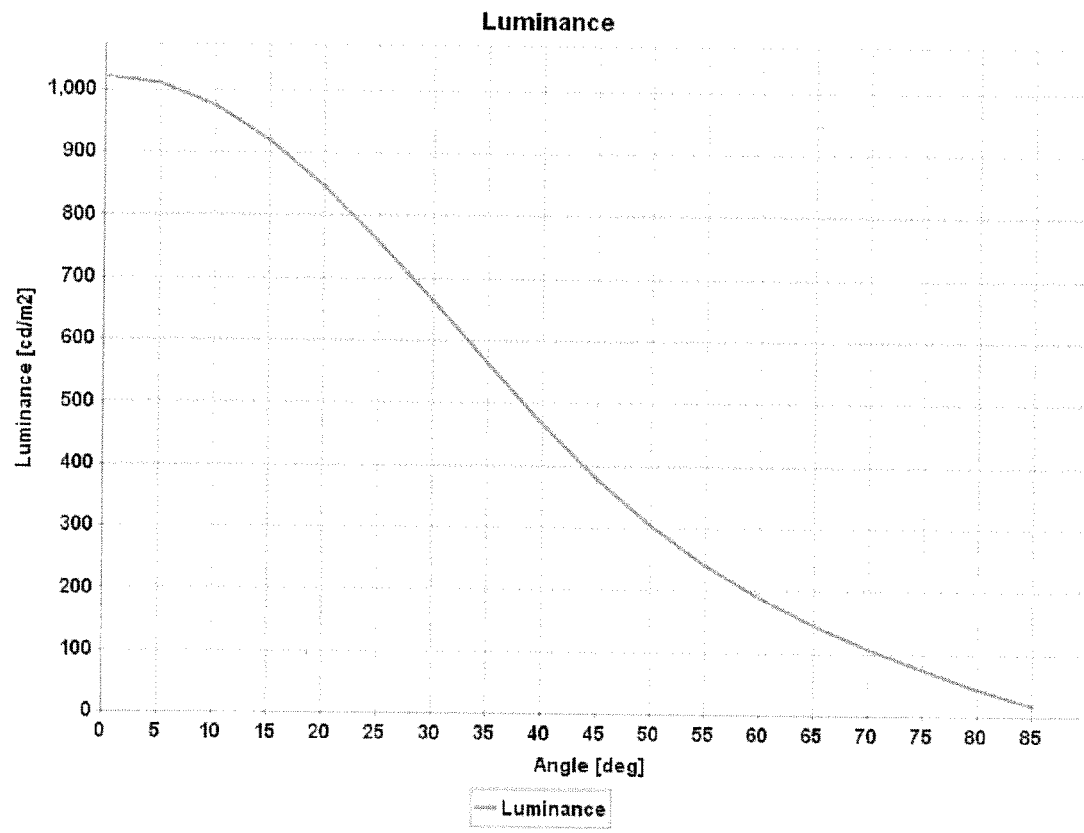
FIG. 3 is an optical characteristic curve of luminance of a blue light device in the prior art changing with the horizontal viewing angle.

Taking a blue light device for example, FIG. 2 is an optical characteristic curve of color coordinate (i.e., CIE coordinate) of a blue light device in the prior art changing with the horizontal viewing angle; and FIG. 3 is an optical characteristic curve of luminance of a blue light device in the prior art changing with the horizontal viewing angle. It can be seen that as the horizontal viewing angle increases, the luminance of the blue light device decreases compared with the luminance of direct vision; however, the x color coordinate value of the blue light device gradually increases, the y color coordinate value gradually decreases. Therefore, when viewed in a direction having an angle with respect to the direction of direct vision, the color of the blue pixel is deepened to dark blue; the color of the light is purer. The changes in color coordinates of green light device and red light device are the same. The embodiments of the present invention apply this optical effect, change the spatial structure of micro-cavity OLED, such that the color coordinates of pixels in the direction of direct vision are changed with respect to the prior art; therefore, more gorgeous colors can be viewed.

In an embodiment of the present invention, a surface of the substrate corresponding to micro-cavity organic light emitting diodes with one color (e.g., blue) comprises slope surfaces; in such a situation, when viewing the display device in the direction of direct vision, the color of the pixels with this color is deepened, and the color gamut is enlarged. It can be understood that, if a surface of the substrate corresponding to micro-cavity organic light emitting diodes with two colors (e.g., blue and green) comprises slope surfaces, when viewing the display device in the direction of direct vision, the colors of the pixels with these colors are deepened, and the color gamut is enlarged; if a surface of the substrate corresponding to micro-cavity organic light emitting diodes with red, green and blue colors comprises slope surfaces, when viewing the display device in the direction of direct vision, the colors of the pixels with these colors are deepened, and the display colors are more gorgeous.

In the embodiments of the present invention, an angle exists between a light emitting surface of at least one micro-cavity organic light emitting diode 2 and the plane of the substrate 1, such that the light with shorter wavelengths in the spectrum of the micro-cavity organic light emitting diode can be emitted in the direction of direct vision. The color coordinate value of a pixel can thus be changed, the pixel color is deepened, the color gamut of the display device is enlarged, the display color is more gorgeous, and the display quality is greatly improved.

It can be seen from FIG. 2 that, the change in color coordinate for the blue light device is more significant when the horizontal viewing angle is less than 40 degrees. Therefore, the slope angle of the slope surface 3 is preferably less than 40 degrees. When the slope angle of the slope surface is less than 40 degrees (i.e., the angle of inclination for the micro-cavity organic light emitting diode is less than 40 degrees), the color gamut of the display device can be enlarged significantly, and the display quality of the display device can be greatly improved.

As shown in FIG. 4, roots of the slope surfaces 3 are parallel to the column direction; and the tilt directions of slope surfaces 3 corresponding to two adjacent micro-cavity organic light emitting diodes 2 with the same color in the row direction are contrary. Compared with the prior art, such a design can increase the color gamut of the display device; the range of visual angle for the display device will not be reduced in horizontal direction; however, the range of visual angle for the display device can be further increased in horizontal direction. For example, the range of visual angle for the existing micro-cavity OLED display device is −75 degrees to 75 degrees; the slope angle θ of the slope surface is 15 degrees, with the array substrate according to the embodiments of the present invention, the range of visual angle for the display device is enlarged as −90 degrees to 90 degrees.

In the context of the present invention, the "root" of the slope surface refers to the line obtained by intersection of the slope surface and the plane of the substrate.

In another preferred embodiment of the present invention, roots of the slope surfaces are parallel to the row direction; and the tilt directions of slope surfaces corresponding to two adjacent micro-cavity organic light emitting diodes with the same color in the column direction are contrary. Similar with the principle of the embodiment shown in FIG. 4, such a design can increase the color gamut of the display device; the range of visual angle for the display device will not be reduced in vertical direction; however, the range of visual angle for the display device can be further increased in vertical direction.

Optionally, the slope surface is a slope of a wedge bulge on the substrate, or, the slope surface is a slope of a wedge depression on the substrate.

Figure 6:
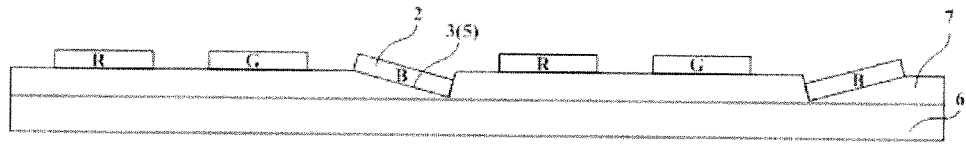
FIG. 6 is a cross section structural schematic diagram of an OLED array substrate according to the third embodiment of the present invention.
Figure 7:
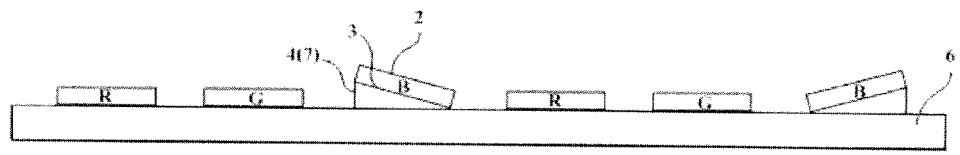
FIG. 7 is a cross section structural schematic diagram of an OLED array substrate according to the fourth embodiment of the present invention.

As shown in FIGS. 6 and 7, the substrate 1 can be a multilayer structure; the substrate 1 can comprises a substrate board 6 and a graphic layer 7 on the substrate board 6, the slope surface 3 is formed on the graphic layer 7. For example, as shown in FIG. 6, by etching the graphic material layer deposited on the substrate board 6, a graphic layer 7 with the wedge depressions 5 can be formed. For example, as shown in FIG. 7, by etching the graphic material layer deposited on the substrate board 6, only the graphic layer 7 formed with the wedge bugles 4 is left on the substrate board 6. By forming the wedge depressions 5 or the wedge bugles 4 with etching process, the process is simplified and the cost is low. Materials for the graphic layer 7 can be silicon dioxide, silicon nitride, etc.; the thickness of the graphic layer 7 can be determined by the slope angle of the slope surface 3, the dimensions of the light emitting devices and related experience.

Figure 5:
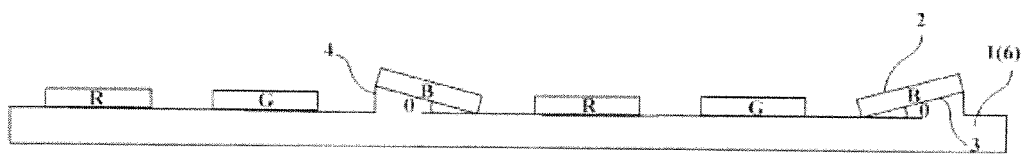
FIG. 5 is a cross section structural schematic diagram of an OLED array substrate according to the second embodiment of the present invention.

The material of the substrate board 6 is not limited. For example, the substrate board 6 can be a glass substrate, a resin substrate and so on. As shown in FIG. 4, the substrate board can be modified with micro structure technology, such that the position on the substrate board 6 corresponding to a micro-cavity OLED 2 has a wedge depression 5, the slope surface of the wedge depression 5 being a surface for manufacturing the light emitting device; or, as shown in FIG. 5, the position on the substrate board 6 corresponding to a micro-cavity OLED 2 has a wedge bugle 4, the slope surface of the wedge bugle 4 being a surface for manufacturing the light emitting device.

Figure 8:
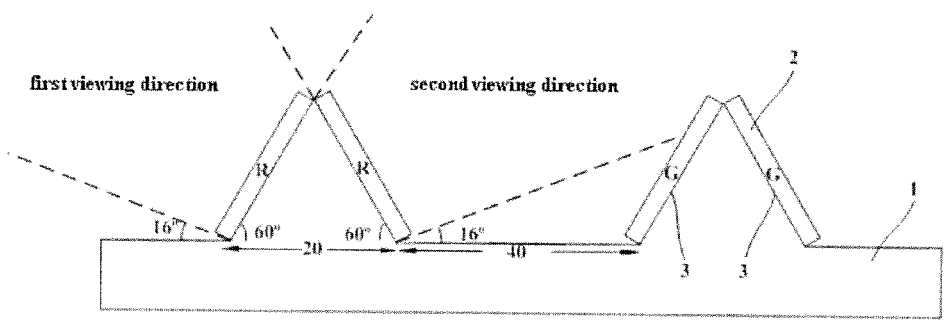
FIG. 8 is a cross section structural schematic diagram of an OLED array substrate according to the fifth embodiment of the present invention.

As shown in FIG. 8, in this embodiment, the slope angle of the slope surface 3 is greater than 40 degrees; two adjacent slope surfaces 3 form an inverted V shape and correspond to micro-cavity organic light emitting diodes 2 with the same color.

Such a solution can not only enlarge the color gamut of the display device, but also apply the array substrate in a display device with double vision function due to the shielding effect between the pixels. The application flexibility of the array substrate can be improved greatly. During the evaporation of the OLED, one strip structure of a fine metal mask (FMM) can be used to evaporate light emitting devices on two slope surfaces, the evaporation process is relatively simplified.

As shown in FIG. 8, the slope angle of the slope surface is 60 degrees, i.e., the cross-section shape of the wedge bugle on the substrate 1 is an equilateral triangle. In this way, the open ratio and the resolution of a double vision display device can be consistent with the prior art when viewed in any direction. In this embodiment, the side length of the equilateral triangle is 20 microns; the pitch of the adjacent wedge bulges is 40 microns; while the range of visual angle in any viewing direction is 16 degrees to 60 degrees.

An embodiment of the present invention further provides a manufacturing method of an organic light emitting diode array substrate, wherein the method comprises:

forming multiple micro-cavity organic light emitting diodes arranged in arrays on a substrate; wherein an angle exists between a light emitting surface of at least one micro-cavity organic light emitting diode and the plane of the substrate.

The organic light emitting diode array substrate manufactured by the method can be applied in a display device; the color gamut of the display device is enlarged, the display color is more gorgeous, and the display quality is greatly improved.

Figure 9:
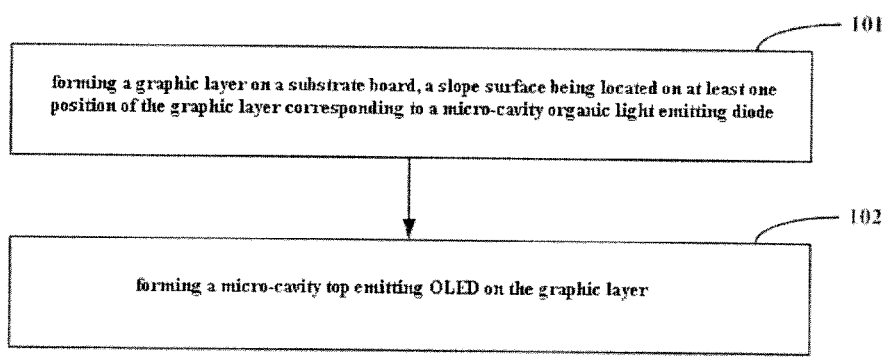
FIG. 9 is a flow diagram of the manufacturing method of an organic light emitting diode array substrate according to an embodiment of the present invention.

As shown in FIG. 9, a manufacturing method of an organic light emitting diode array substrate according to an embodiment of the present invention comprises:

step 101, forming a graphic layer on a substrate board, a slope surface being located on at least one position of the graphic layer corresponding to a micro-cavity organic light emitting diode;

step 102, forming a micro-cavity organic light emitting diode on the graphic layer.

The micro-cavity organic OLED can be formed with an evaporation process, and the slope surfaces can be used as the surface of the evaporation process. The organic light emitting diode array substrate manufactured by the method can be applied in a display device; the color gamut of the display device is enlarged, the display color is more gorgeous, and the display quality is greatly improved.

In particular, the step 101 can specifically comprise:

forming a graphic material layer on the substrate board;

etching the graphic material layer to form a wedge bulge or a wedge depression corresponding to the position of at least one micro-cavity organic light emitting diode.

By etching the graphic material layer deposited on the substrate board, a graphic layer formed with the wedge depressions can only be left on the substrate board; or, by etching the graphic material layer deposited on the substrate board, a graphic layer formed with the wedge bugles can only be left on the substrate board. By forming the wedge depressions or the wedge bugles with etching process, the process is simplified and the cost is low.

In an optional embodiment, the step of forming multiple micro-cavity organic light emitting diodes arranged in arrays on a substrate comprises:

forming a micro-cavity organic light emitting diode on a substrate board, a slope surface being located on at least one position of the substrate board corresponding to a micro-cavity organic light emitting diode. This solution applies a modified substrate board, and the micro-cavity organic light emitting diodes can be manufactured on the substrate board directly.

An embodiment of the present invention also provides a display device comprising an organic light emitting diode array substrate as stated above. The color gamut of the display device is large, the display color is more gorgeous, and the display quality is greatly improved. The specific type of the display device is not limited. The display device can be an OLED display panel, an OLED display, an OLED TV and so on.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. An organic light emitting diode array substrate comprising a substrate and multiple micro-cavity organic light emitting diodes which are disposed on the substrate and are arranged in arrays;

wherein an angle exists between a light emitting surface of at least one obliquely arranged micro-cavity organic light emitting diode and a plane of the substrate, wherein the light emitting surface is planar;

wherein a slope surface is located on at least one position of the substrate corresponding to the obliquely arranged micro-cavity organic light emitting diode; wherein the slope surface forms a constant slope angle with respect to the plane of the substrate;

and wherein one of: a root of the slope surface is parallel to a column direction; and a tilt direction of the slope surface corresponding to two adjacent micro-cavity organic light emitting diodes with the same color in a row direction are contrary; and the root of the slope surface is parallel to the row direction; and the tilt direction of the slope surface corresponding to two adjacent micro-cavity organic light emitting diodes with the same color in the column direction are contrary.

2. The organic light emitting diode array substrate according to claim 1, wherein the slope angle of the slope surface is less than 40 degrees.

3. The organic light emitting diode array substrate according to claim 1, wherein the slope surface is a slope of a wedge bulge on the substrate, or, the slope surface is a slope of a wedge depression on the substrate.

4. The organic light emitting diode array substrate according to claim 3, wherein the organic light emitting diode array substrate further comprises a graphic layer located on the surface of the substrate, the slope surface is formed on the graphic layer; alternatively, the slope surface is formed on the surface of the substrate.

5. The organic light emitting diode array substrate according to claim 1, wherein the slope angle of the slope surface is greater than 40 degrees; two adjacent slope surfaces form an inverted V shape and correspond to micro-cavity organic light emitting diodes with the same color.

6. The organic light emitting diode array substrate according to claim 5, wherein the slope angle of the slope surface is 60 degrees.

7. A display device comprising an organic light emitting diode array substrate; the organic light emitting diode array substrate comprises a substrate and multiple micro-cavity organic light emitting diodes which are disposed on the substrate and are arranged in arrays;

wherein an angle exists between a light emitting surface of at least one obliquely arranged micro-cavity organic light emitting diode and a plane of the substrate, wherein the light emitting surface is planar;

wherein a slope surface is located on at least one position of the substrate corresponding to the obliquely arranged micro-cavity organic light emitting diode; wherein the slope surface forms a constant slope angle with respect to the plane of the substrate;

and wherein the root of the slope surface is parallel to a column direction; and the tilt direction of the slope surface corresponding to two adjacent micro-cavity organic light emitting diodes with the same color in the row direction are contrary; alternatively, the root of the slope surface is parallel to the row direction; and the tilt direction of the slope surface corresponding to two adjacent micro-cavity organic light emitting diodes with the same color in the column direction are contrary.

8. A manufacturing method of the organic light emitting diode array substrate according to claim 1, wherein the method comprises:

forming multiple micro-cavity organic light emitting diodes arranged in arrays on a surface of a substrate;

wherein an angle exists between a light emitting surface of at least one obliquely arranged micro-cavity organic light emitting diode and a plane of the substrate, wherein the light emitting surface is planar;

wherein a slope surface is located on at least one position of the substrate corresponding to the obliquely arranged micro-cavity organic light emitting diode; wherein the slope surface forms a constant slope angle with respect to the plane of the substrate;

and wherein one of: a root of the slope surface is parallel to a column direction; and the tilt directions of slope surfaces corresponding to two adjacent micro-cavity organic light emitting diodes with the same color in the row direction are contrary; and the root of the slope surface is parallel to a row direction; and the tilt direction of the slope surface corresponding to two adjacent micro-cavity organic light emitting diodes with the same color in the column direction are contrary.

9. The manufacturing method according to claim 8, wherein the step of forming multiple micro-cavity organic light emitting diodes arranged in arrays on a surface of a substrate comprises:

forming a graphic layer on a surface of a substrate, a slope surface being located on at least one position of the graphic layer corresponding to a micro-cavity organic light emitting diode;

forming a micro-cavity organic light emitting diode on the graphic layer.

10. The manufacturing method according to claim 9, wherein the step of forming a graphic layer on a surface of a substrate comprises:

forming a graphic material layer on a surface of a substrate;

etching the graphic material layer to form a wedge bulge or a wedge depression corresponding to the position of at least one micro-cavity organic light emitting diode.

11. The manufacturing method according to claim 8, wherein the step of forming multiple micro-cavity organic light emitting diodes arranged in arrays on a surface of a substrate comprises:

forming a micro-cavity organic light emitting diode on a surface of a substrate, a slope surface being located on at least one position of the substrate corresponding to a micro-cavity organic light emitting diode.

* * * * *